(12) United States Patent
Tsuda et al.

(10) Patent No.: US 11,487,430 B2
(45) Date of Patent: Nov. 1, 2022

(54) REDUCING DATA USING A PLURALITY OF COMPRESSION OPERATIONS IN A VIRTUAL TAPE LIBRARY

(71) Applicant: INTERNATIONAL BUSINESS MACHINES CORPORATION, Armonk, NY (US)

(72) Inventors: Takahiro Tsuda, Tokyo (JP); Koichi Masuda, Tokyo (JP); Sosuke Matsui, Tokyo (JP); Takeshi Nohta, Tsukuba (JP); Shinsuke Mitsuma, Tokyo (JP); Kousei Kawamura, Tokyo (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/923,372

(22) Filed: Mar. 16, 2018

(65) Prior Publication Data
US 2019/0286333 A1 Sep. 19, 2019

(51) Int. Cl.
*G06F 3/06* (2006.01)
(52) U.S. Cl.
CPC ............ *G06F 3/0608* (2013.01); *G06F 3/067* (2013.01); *G06F 3/0659* (2013.01); *G06F 3/0664* (2013.01); *G11C 2207/102* (2013.01)
(58) Field of Classification Search
CPC .... G06F 3/0608; G06F 3/0659; G06F 3/0664; G06F 3/067
See application file for complete search history.

(56) References Cited

U.S. PATENT DOCUMENTS 5,761,536 A * 6/1998 Franaszek ............. G06F 12/023
341/55
8,054,879 B2 11/2011 Fallon et al.
(Continued)

FOREIGN PATENT DOCUMENTS

WO 2006090412 A2 8/2006

OTHER PUBLICATIONS https://whatis.techtarget.com/definition/streaming-media taken by archive.org on Dec. 24, 2017 that describes the term "stream" (Year: 2017).*

(Continued)

*Primary Examiner* — William E. Baughman
*Assistant Examiner* — Janice M. Girouard
(74) *Attorney, Agent, or Firm* — Griffiths & Seaton PLLC

(57) ABSTRACT

Embodiments are provided for reducing data using a plurality of compression operations in a computing storage environment. A speed of data writing to a virtual tape device and an availability of one or more processor devices for the virtual tape device may be monitored. One or more requests may be received for writing data to the virtual tape device. Data to be written to the virtual tape device, corresponding to a selected number of the one or more requests for writing the data, may be compressed according to both the speed of data writing to the virtual tape device and the availability of one or more processor devices for the virtual tape device. The compressed data may be stored in the virtual tape device in record units. Non-compressed data may be compressed in the virtual tape device at a subsequent period of time (e.g., future time period).

14 Claims, 10 Drawing Sheets

(56) References Cited

U.S. PATENT DOCUMENTS

| | | | |
|---|---|---|---|
| 8,806,062 B1* | 8/2014 | Vertongen | G06F 11/1464 |
| | | | 709/247 |
| 8,836,548 B1 | 9/2014 | Chandra | |
| 9,582,207 B1 | 2/2017 | McCloskey | |
| 2015/0046398 A1* | 2/2015 | Camble | G06F 11/1453 |
| | | | 707/634 |
| 2015/0242309 A1* | 8/2015 | Talagala | G06F 3/064 |
| | | | 711/103 |
| 2017/0123704 A1* | 5/2017 | Sharma | H03M 7/30 |
| 2017/0199707 A1* | 7/2017 | Varghese | G06F 3/0661 |
| 2018/0074723 A1* | 3/2018 | Delaney | G06F 3/0608 |

OTHER PUBLICATIONS

An article "video Streaming: Concepts, Algorithms, and Systems by John G Apostolopoulos", Sep. 18, 2002 that clarifies that audio video streams are characterized by compression at the source, before being sent over the network. (Year: 2002).*

Fischer, "NetApp offers virtual tape library with compression," Computerworld, Oct. 17, 2006 (3 pages).

* cited by examiner

REDUCING DATA USING A PLURALITY OF COMPRESSION OPERATIONS IN A VIRTUAL TAPE LIBRARY

BACKGROUND OF THE INVENTION

Field of the Invention

The present invention relates in general to computing systems, and more particularly to, various embodiments for reducing data using a plurality of compression operations in a computing storage environment using a computing processor.

Description of the Related Art

Data storage libraries provide a means of storing large amounts of data for host computer systems. Automated data storage libraries are known for providing cost effective storage and retrieval of large quantities of data, typically from data storage cartridges stored in storage slots of the library. The libraries typically comprise large numbers of data storage media that are stored in storage shelves, numbers of data storage drives to read and write data with respect to the data storage media, one or more robot accessors to access the data storage media to move the data storage media between the storage shelves and data storage drives, and control units to control the operation of the library and control the flow of data and information between the library and host computer systems. The data storage cartridges are typically extracted from the storage slots, placed in the storage slots, and transported within the library by one or more accessors.

SUMMARY OF THE INVENTION

Various embodiments are provided for reducing data using a plurality of compression operations in a computing storage environment by a processor. A speed of data writing to a virtual tape device and an availability of one or more processor devices for the virtual tape device may be monitored. One or more requests may be received for writing data to the virtual tape device. Data to be written to the virtual tape device, corresponding to a selected number of the one or more requests for writing the data, may be compressed according to both the speed of data writing to the virtual tape device and the availability of one or more processor devices for the virtual tape device. The compressed data may be stored in the virtual tape device in record units. After writing the data to the virtual tape device is completed, non-compressed data may be compressed in the virtual tape device at a subsequent period of time (e.g., future time period).

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

Virtual tapes are typically emulated by a virtual tape library. A virtual tape library comprises a computing system executing a tape virtualization software. This tape virtualization software emulates virtual tape drives, virtual tape libraries and virtual tapes. A virtual tape library may be connected via an interface and a network—such as a Storage Area Network (SAN) or Local Area Network (LAN)—to the storage management application. The storage management application "sees" the virtual tape devices and virtual tapes just as real tape devices. When the storage management application writes a virtual tape, this virtual tape is stored on a disk system also comprised in the virtual tape library. Each virtual tape in a virtual tape library may have a unique serial number which is also called VOLSER. The VOLSER allows the unique identification of a virtual tape in a virtual tape library.

A virtual tape server (VTS) may virtualize a tape volume, and the tape volume on the VTS handled by a host application may be present in the VTS as a logical volume (also referred to as LVOL, a logical tape volume, or a virtual tape volume). The logical volume may be present in a disk device, under the control of the VTS, called a cache serving as a virtual storage region or in a physical tape library also under the control of the VTS. The logical volume present in the cache may be transferred (hereinafter referred to as "migrate" or "migration") to a physical tape volume (hereinafter referred to as a physical volume) in the physical tape library if the LVOL is not referred to for a long time or in accordance with a storage management policy.

In one aspect, virtual tape servers ("VTS"), such as the IBM® TS7700, may include a disk cache subsystem, which may be installed with a variety of different physical disk drive media (DDM). This encompasses different physical drive types, capacities, manufacturers, rotational speeds, etc.

Figure 4:
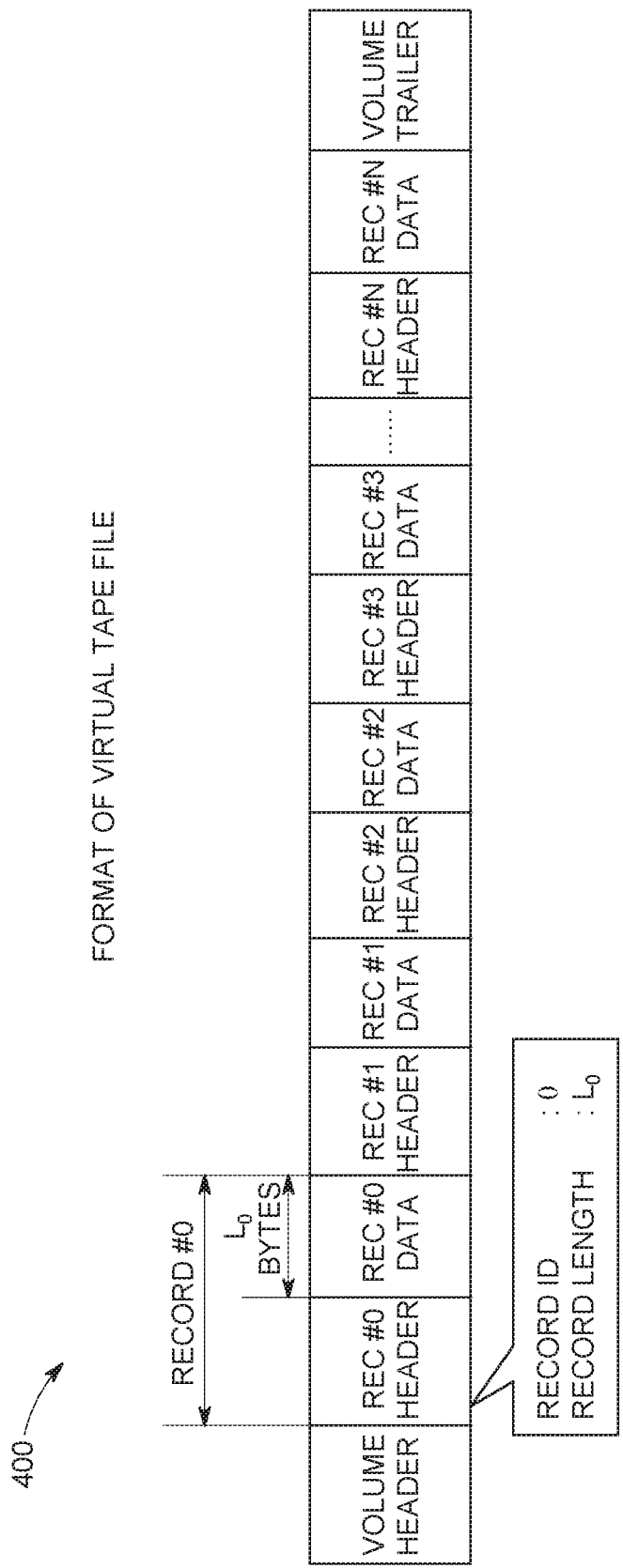
FIG. 4 is a diagram depicting an exemplary format of a virtual tape device in accordance with an embodiment of the present invention.

Additionally, the VTS may read data from and/or write data to a storage device such as, for example, a hard disk drive (HDD), which may be in a format of a virtual tape device. The virtual tape device may emulate a physical tape. The virtual tape device (such as a virtual tape device of the IBM TS7700) may have, for example, a format as illustrated in FIG. 4. For example, FIG. 4 depicts a volume header, a volume trailer, one or more record headers (e.g., record "rec" #0, rec #N), and record data (e.g., rec #0 data, . . . , rec #N data). For example, a record header (e.g., Rec #0 header) and record data (e.g., rec #0 data) is illustrated for record #0. The record header (e.g., Rec #0 header) for record #0 depicts a record identifier ("ID") as "0" and a record length ("$L_0$" of $L_0$ bytes). The data may be read from and/or written to the virtual tape device in record units similar to an actual tape storage.

In one aspect, has used herein, the virtual tape device (which may be a virtual tape system "VTS") may control a virtual tape device by using processor devices (central processing unit "CPU") resources of the VTS. A host application may write a virtual tape file by using virtual tape device that the VTS provides.

Figure 5:
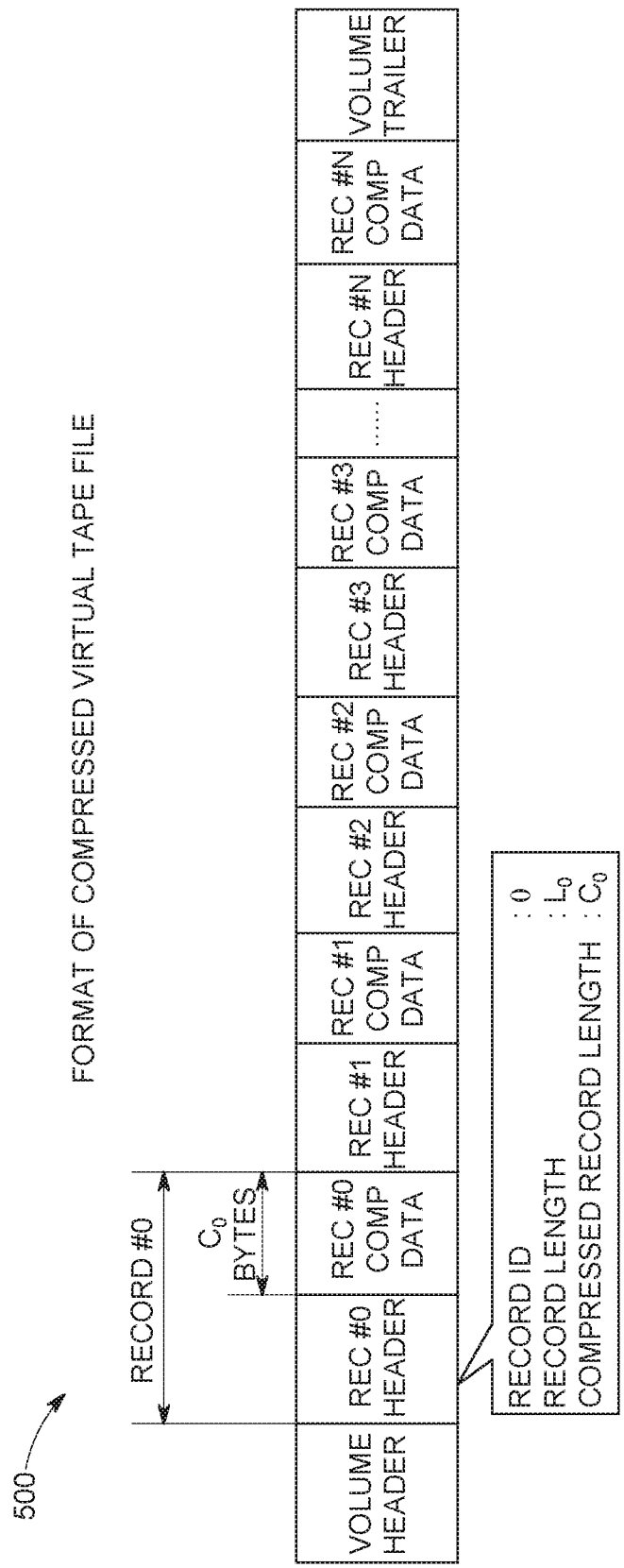
FIG. 5 is a diagram depicting an exemplary format of a compressed virtual tape device in accordance with an embodiment of the present invention.

It is important for the virtual tape apparatus that the capacity of a storage device such as, for example, an HDD to which the virtual tape apparatus is written be used efficiently. Thus, in one embodiment, data may be compressed in real time when the data is written into a virtual tape apparatus to reduce the bandwidth necessary for writing to the storage device (e.g., a virtual tape device/apparatus) and the capacity of the storage necessary for saving. When data is compressed, for example, the virtual tape device of a VTS such as, for example, the IBM® TS7700 may have a format as depicted in FIG. 5. For example, FIG. 5 depicts a volume header, a volume trailer, one or more record headers (e.g., record "rec" #0, rec #N) and record compressed ("comp") data (e.g., rec #0 comp data, . . . , rec #N comp data). For example, a record header (e.g., Rec #0 header) and record comp data (e.g., rec #0 comp data) is illustrated for record #0. The record header (e.g., Rec #0 header) for record #0 depicts a record identifier ("ID") as "0," a record length ("$L_0$"), and a compressed record length ("$C_0$" of $C_0$ bytes).

Since data is compressed in record units, data can be decompressed and read in record units. That is, data may be compressed record-by-record, so the data can be decompressed and read in record-by-record. When data is compressed by software in real time, the speed of compression processing may be a bottleneck of the data writing speed. Furthermore, since a higher compression algorithm tends to use more processing devices (e.g., central processing unit "CPU" resources), particularly when a large volume of data is written in parallel, compression processing by an application may negatively affect performance of the entire system. In one aspect, dedicated hardware may be used to perform real-time compression without affecting the data writing speed or CPU resources of the entire system, which may create computing inefficiency since the cost is higher as compared to an operation that provides compression by application (e.g., compression by software). For this reason, real-time data compression by application can also preferably reduce the bandwidth necessary for writing data and the capacity of the storage necessary for saving the data without having effects such as, for example, a reduction in the data writing speed or lack of CPU resources on the system.

Accordingly, various embodiments are provided herein for reducing data using a plurality of compression operations in a computing storage environment by a processor. A speed of data writing to a virtual tape device and an availability of one or more processor devices for the virtual tape device may be monitored. One or more requests may be received for writing data to the virtual tape device. Data to be written to the virtual tape device, corresponding to a selected number of the one or more requests for writing the data, may be compressed according to both the speed of data writing to the virtual tape device and the availability of one or more processor devices for the virtual tape device. The compressed data may be stored in the virtual tape device in record units. After writing the data to the virtual tape device is completed, non-compressed data may be compressed in the virtual tape device at a subsequent period of time (e.g., future time period).

In one aspect, when data is written to the virtual tape device, the data may be "compressed by software" in real time for a selected number of records (e.g., every few records) depending on the speed of writing data to a storage device (e.g., the virtual tape device from a host perspective or a disk cache of the VTS) and the availability of CPU resources. It is thereby possible to reduce the bandwidth used for writing to the storage device and the amount of data saved without having negative effects such as, for example, a reduction in the data writing speed and the lack of CPU resources on the system. Furthermore, records in the virtual tape device, which have not been compressed during the data writing, may be compressed after writing the data to the virtual tape device is completed and when the amount of Input/Outputs ("I/O") to and/or from the storage device is less than a defined amount, a threshold, or small size, that is, and when there are sufficient CPU resources. In one aspect, a "small" size may be a size below a defined threshold. For example, if a user has priority to writing new data from a host, the threshold may be relatively low (e.g., more bandwidth should be used for writing new data from the host). If a user has priority to reducing data size on a storage device of VTS (disk cache), the threshold may be relatively high (e.g., more bandwidth may be used for reading already existing non-compressed data and writing the data compressed subsequently). In one aspect, the threshold may be an amount of read/write rate that is lower than 20% of a maximum read/write rate of the system.

Each of the records in the virtual tape device may be compressed (e.g., eventually compressed) and only those records, having the same capacity as that in the case where all the records are compressed at the time of writing, may be saved in the storage device. Since data in the virtual tape device is read and/or written in record units, corresponding compression/decompression of data may also be performed in record units. Therefore, even when compressed and non-compressed records coexist in the virtual tape device, there are no challenges or problems accessing a virtual tape device in which compressed and non-compressed records coexist. During read operations of the data, only the necessary records need to be decompressed (as compared with each of the records), and when records are subsequently compressed, only non-compressed records may be compressed.

When data is written to virtual tape devices, the present invention compresses the data every few records by software in real time depending on how fast write speed is and how much CPU resource is idle. The present invention prevents real time software compression from having a negative influence (e.g., a degradation of write speed or lack of CPU resource to the system) and may also reduce bandwidth used for writing data to the storage device and amount of data written to the storage device to a certain degree. In addition, when there are only a few I/Os (e.g., less than 10 I/Os) and one or more CPUs are available (e.g., CPUs that are idle) after data has been written to virtual tape devices, mechanisms of the present invention may compress non-compressed records which were skipped and not compressed when these non-compressed records were originally written to the virtual tape devices. This results in all records in the virtual tape devices to become compressed and the amount of data stored in the virtual tape devices is similar to the scenario when all records written to the virtual tape devices are compressed in real time. Data in a virtual tape device is read and/or written in record-by-record so data may also be compressed and/or decompressed in record-by-record. Therefore, any challenges are eliminated relating to reading data from a virtual tape device that include compressed records and non-compressed records that co-exist in a virtual tape device. Thus, the present invention enables the decompression and reading of a record from a virtual tape device and enables the compression of a non-compressed record in the virtual tape device at a subsequent period of time.

Figure 1:
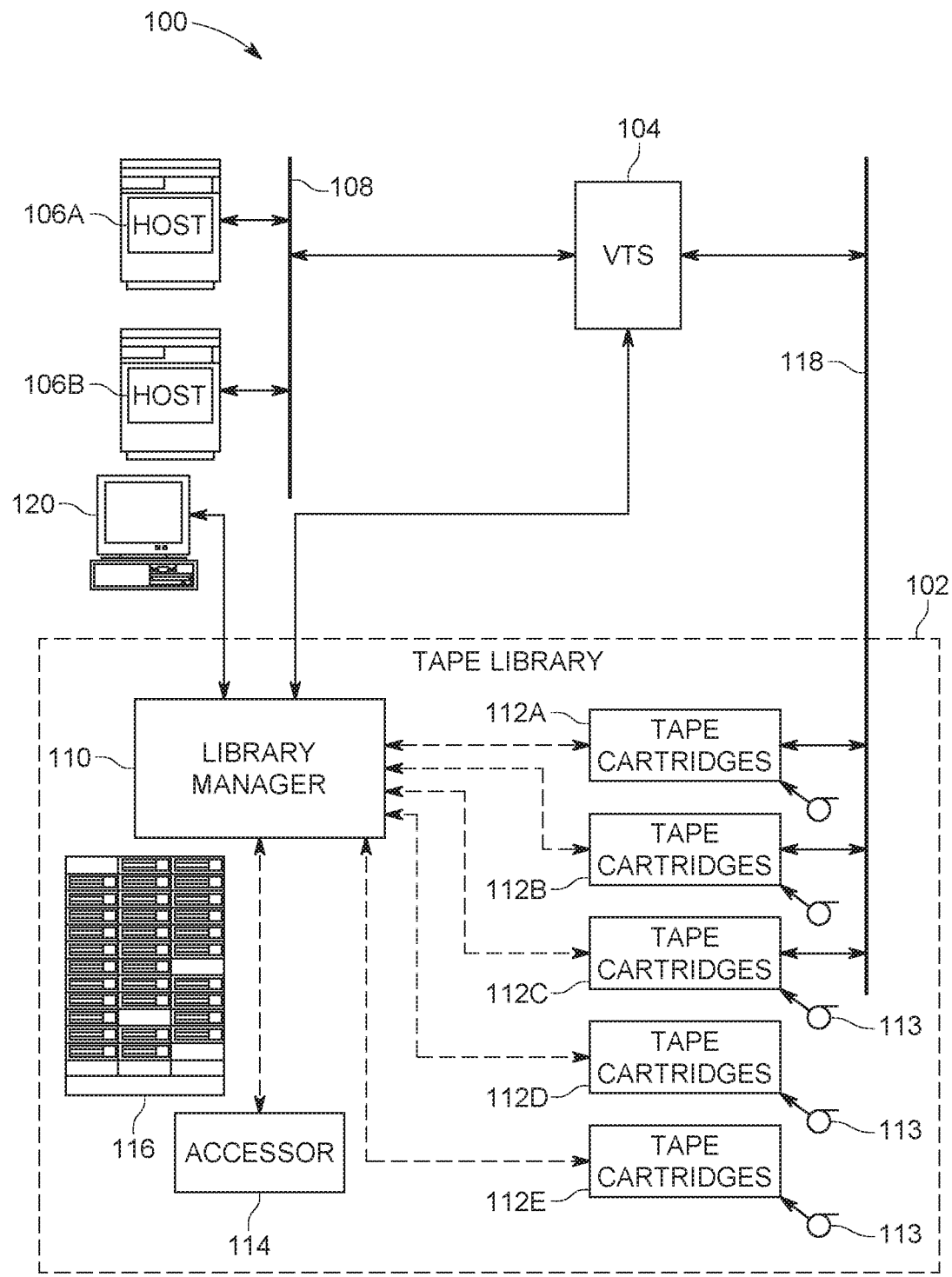
FIG. 1 illustrates an exemplary embodiment of a representative virtual ape system.

As a preliminary matter, FIG. 1 illustrates an exemplary embodiment of a representative virtual tape system 100, in accordance with the present invention. The system 100 includes a tape library 102, at least one VTS 104, and at least one host 106 (shown as 106A and 106B). Each host 106 may be a mainframe computer. Alternatively, the host (users) 106 may be servers or personal computers using a variety of operating systems. The host 106 and the VTS 104 are connected via a storage area network (SAN) 108 or another suitable communications channel.

The tape library 102 may include a library manager 110, one or more data drive devices, which may be tape cartridges 112 (shown as 112A-E), an accessor 114, and a plurality of mountable media 116. In one embodiment, the mountable media 116 includes tape cartridges, magnetic disks, optical disks, CDs, DVDs, other devices that can store data and be mounted to a drive unit, and the like. The library manager 110, which includes at least one computing processor, may be interconnected with and may control the actions of the tape cartridges 112 and the accessor 114. The library manager 110 may include one or more hard disk drives (not shown) for memory storage, as well as, a control panel or keyboard (not shown) to provide user input. The control panel may be a computer in communication with the library manager 110 so that a user can control the operating parameters of the automated tape library 102 independently of one or more hosts 106.

In FIG. 1, five tape cartridges 112A, 112B, 112C, 112D, and 112E are shown. The present invention is operable with one or more tape drives 113. The tape drives 113 are configured for assisting with the mounting and demounting of user data and log data. The tape cartridges 112 may share one single repository of mountable media 116. Alternatively, the tape cartridges 112 may utilize multiple repositories of mountable media 116. The tape cartridges 112 may advantageously be distributed over multiple locations to decrease the probability that multiple tape cartridges 112 will be incapacitated by a disaster in one location.

The interconnections between the library manager 110, the tape cartridges 112, and the accessor 114 are shown as dashed lines to indicate that the library manager 110 transmits and receives control signals, rather than data to be stored or retrieved, to the tape cartridges 112 and/or the accessor 114. Data for storage or retrieval may instead be transmitted directly between the VTS 104 and the tape cartridges 112 via a network 118, which may be a storage area network (SAN), local area network (LAN), wide area network (WAN), or another suitable type of network, including the Internet or a direct connection between the VTS 104 and the tape cartridges 112 via a point to point or multi-drop bus connection, for example, a Small Computer Storage Interface (SCSI). Alternatively, control signals for tape drives 112 can be transmitted and received through connections between the VTS 104 and the library manager 110 and the VTS 104 and the tape drives 112 via network 118.

The accessor 114 may be a robotic arm or another mechanical device configured to transport a selected mountable media 116 between a storage bin and tape cartridges 112. The accessor 114 typically includes a gripper and a bar code scanner, or a, similar read system, mounted on the gripper. The bar code scanner is used to read a volume serial number (VOLSER) printed on a cartridge label affixed to the tape cartridges 112. In alternative embodiments, the tape cartridges 112 may be replaced by optical disk drives or other magnetic drives. Similarly, the mountable media 116 and the tape drives 113 may include magnetic media, optical media, or any other removable media corresponding to the type of drive employed. A control console 120 may be connected to the library manager 110. The control console 120 may be a computer in communication with the library manager 110 so that a user can control the operating parameters of the tape library 102 independently of the host 106.

Figure 2:
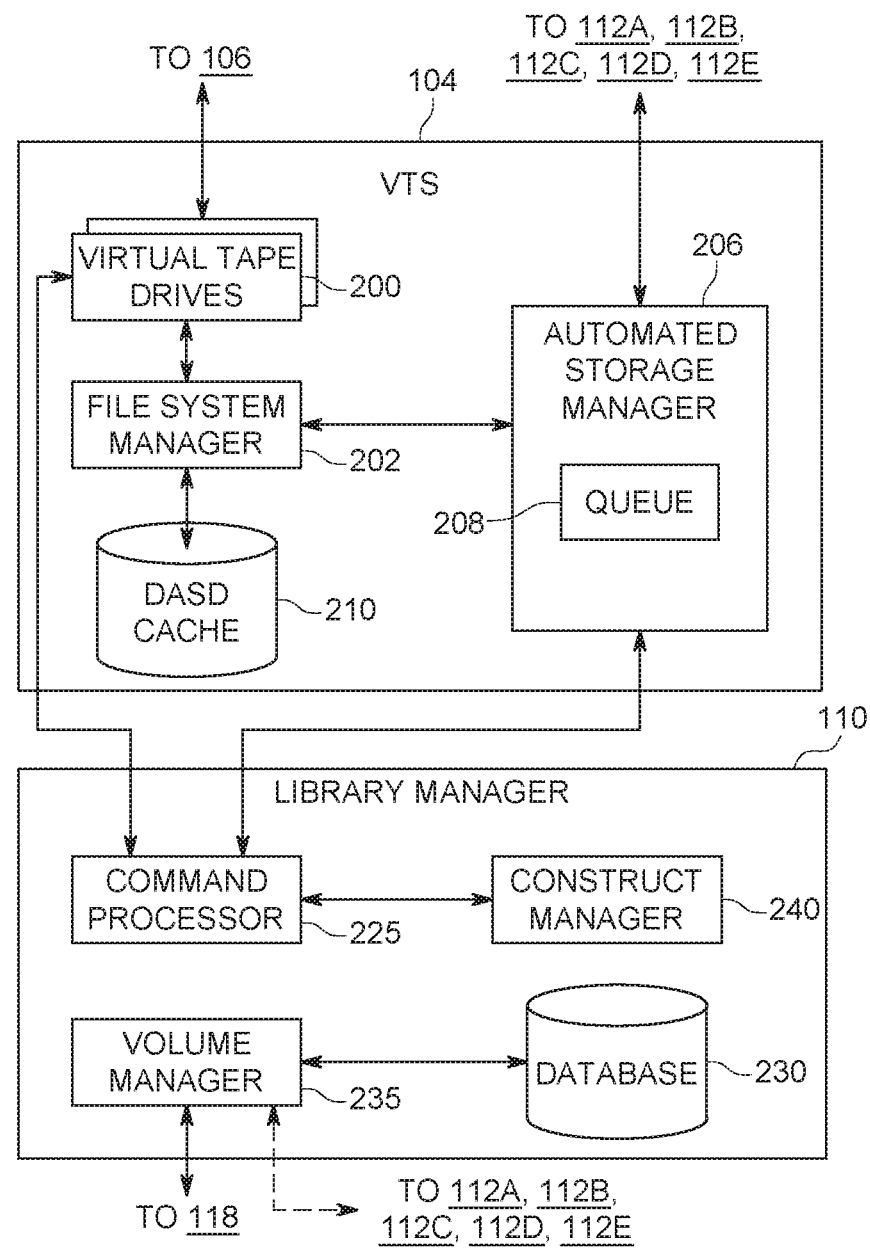
FIG. 2 illustrates an exemplary embodiment of the VTS and library manager.

FIG. 2 illustrates a schematic block diagram depicting one embodiment of the VTS 104 and one embodiment of the library manager 110 of FIG. 1 (such as for flushing data from a cache to a secondary storage). The VTS 104 and the library manager 110 may each take the form of a computer with a bus, processor, memory, and the like. These elements have been omitted from FIG. 2 to more clearly depict the various executable modules and data blocks of the VTS 104 and the library manager 110 pertinent to the invention. There could also be other executable modules and data block known in the art in implementing a VTS 104 or library manager 110 but are omitted to focus on the elements essential to the invention.

As shown, the VTS 104 may include a plurality of virtual tape drives 200, a file system manager 202, an automated storage manager 206, a queue 208, and at least one direct access storage device (DASD) cache 210. The DASD cache 210 may take the form of one or more virtual tape drives that contain data in the form of logical, or virtual, volume and may temporarily store data from the host 106 on virtual or logical volumes in the form of files. A write command from the host 106 is processed by the ITS 104, through a virtual tape drive 200 into the DASD cache 210, prior to transferring the updated logical volume from the DASD cache 210 to the mountable media or physical volume 116 (FIG. 1). According to one example, the DASD cache 210 may also take the form of one or more hard disk drives ("HDD"), which may be arranged in a redundant array of independent drives (RAID configuration), such as RAID 5. The virtual tape drives 200 also process control commands from the host 106.

The file system manager 202 manages and coordinates data storage in the DASD cache 210. The automated storage manager 206 controls the interface communications between the file system manager 202 and the tape cartridges 112. The automated storage manager 206 also controls communications between the VTS 104 and the library manager 110. In one embodiment, the host 106 may request a particular logical volume. The automated storage manager 206 determines whether the logical volume is in the DASD cache 210. If it is not, the automated storage manager 206 requests a recall for it from the physical volume or mountable media 116. The automated storage manager 206 may also contain a queue 208 for temporarily placing additional recall requests to be processed. Thus, the automated storage manager 206 is an apparatus for recalling logical volumes from mountable media 116 by means of the tape cartridges 112A, B, C, D, and E (FIG. 1).

The library manager 110 manages the virtual and physical volumes as well as the constructs. More specifically, the library manager 110 includes the command processor 225 that receives control commands from the virtual tape drives 200 and the automated storage manager 206. The command processor 225 passes instructions about the management of the virtual and physical volumes to the volume manager 235. The volume manager 235 stores information about the virtual and physical volumes on a database 230 of the library manager 110. In addition, depending on the instructions received, the volume manager 235 sends instructions (e.g., via a network 118) to the tape cartridges 112 and/or the accessor 114 to load or "mount" the cartridges or other mountable media 116 on which copies of the virtual volumes are to be made or retrieved. Mounting of multiple cartridges 112 may be generally simultaneous or in a certain order, depending on the configuration of the accessor 114 and the tape cartridges 112.

The library manager 110 also has a construct manager 240 that receives user instructions from the control console 120 regarding the volume management actions to be followed for a given construct name. The volume management actions are stored and retrieved by the construct manager 240 on a database 230 of the library manager 110. For certain control commands received by the command processor 225, the command processor 225 instructs the construct manager 240 to provide the volume management actions for a specific virtual volume. The command processor 225 then passes the returned volume management actions for a specific virtual volume to the automated storage manager 206.

Figure 3:
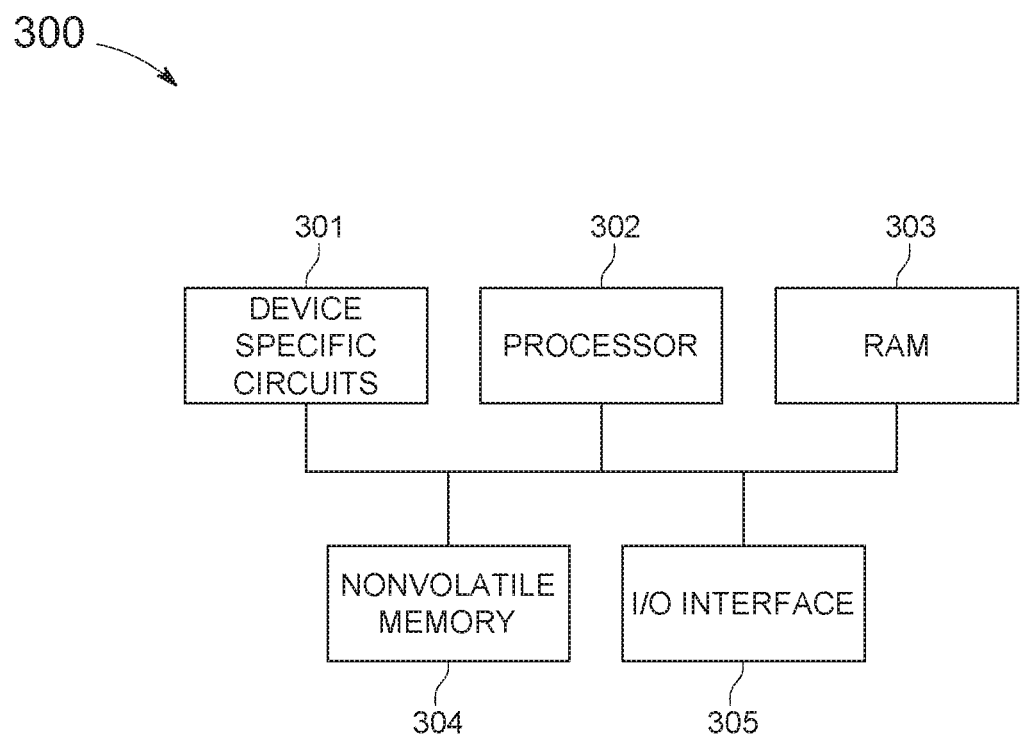
FIG. 3 is a block diagram depicting an exemplary system or controller configuration for use in accordance with an embodiment of the present invention.

FIG. 3 shows a system 300 (e.g., a controller), which may be associated with virtual tape system 100, with a processor 302, RAM (Random Access Memory) 303, nonvolatile memory 304, device specific circuits 301, and I/O interface 305. Alternatively, the RAM 303 and/or nonvolatile memory 304 may be contained in the processor 302 as could the device specific circuits 301 and I/O interface 305. The processor 302 may comprise, for example, an off-the-shelf microprocessor, custom processor, FPGA (Field Programmable Gate Array), ASIC (Application Specific Integrated Circuit), discrete logic, or the like. The RAM (Random Access Memory) 303 may be used to hold variable data, stack data, executable instructions, and the like. The nonvolatile memory 304 may comprise any type of nonvolatile memory such as, but not limited to, EEPROM (Electrically Erasable Programmable Read Only Memory), flash PROM (Programmable Read Only Memory), battery backup RAM, and hard disk drives. The nonvolatile memory 304 may be used to hold the executable firmware and any nonvolatile data. The I/O interface 305 comprises a communication interface that allows the processor 302 to communicate with devices external to the controller. Examples may comprise, but are not limited to, serial interfaces, USB (Universal Serial Bus), Ethernet, or SCSI (Small Computer Systems Interface). The device specific circuits 301 provide additional hardware to enable the system 300 to perform unique functions such as, but not limited to, motor control of a cartridge gripper. The device specific circuits 301 may comprise electronics that provide, by way of example but not limitation, Pulse Width Modulation (PWM) control, Analog to Digital Conversion (ADC), Digital to Analog Conversion (DAC), etc. In addition, all or part of the device specific circuits 301 may reside outside the system 300.

Having previously described FIGS. 4-5, it should be noted that during data writing to the virtual tape device, data may be compressed by software in real time for every few records depending on the speed of data writing to the storage device (e.g., the virtual tape device) and the availability of CPU resources. Since the speed of compression processing and the amount of CPU used vary depending on a compression operation and data to be compressed, a selected writing speed (e.g., a user acceptable writing speed) and a threshold value of available CPU resources may be set. For example, when data is compressed every "X" records, if a process for acquiring a current writing speed "W" and availability "I" of CPU resources from the system at a time interval T exists, the value of X can be dynamically determined through processing as shown in the flowchart in FIG. 6, assuming that a minimum value of the user acceptable writing speed is "Wmin", a minimum value of the user acceptable availability of CPU resources is "Imin."

Figure 6:
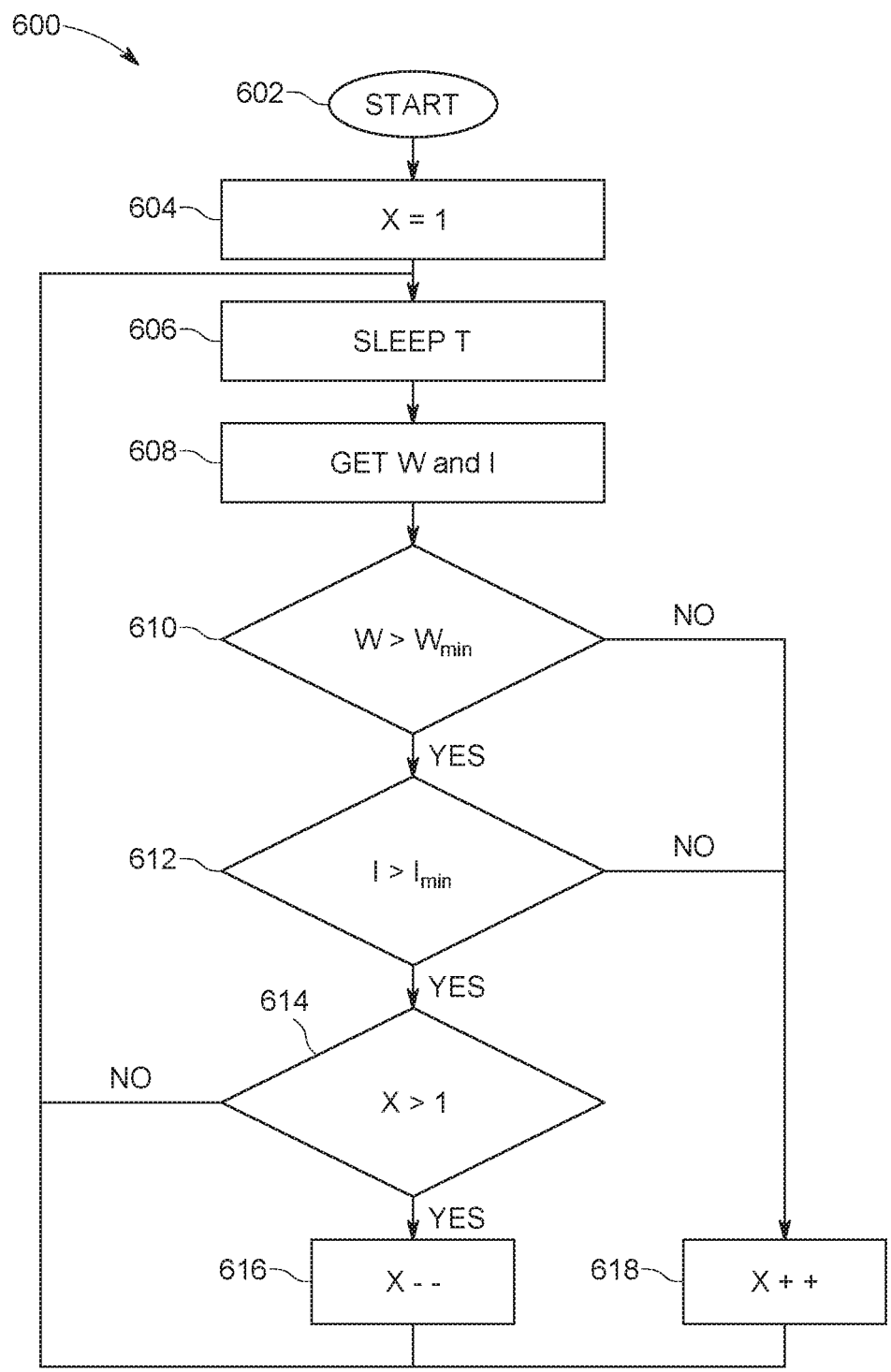
FIG. 6 is a flowchart diagram depicting an exemplary method for determining a time interval for record compression in accordance with an embodiment of the present invention.

That is, FIG. 6 depicts a flowchart diagram depicting an exemplary method for determining a time interval for record compression. In one aspect, the various functionality, or "modules" of functionality, hardware devices, and/or other components in the same descriptive sense as has been previously described in FIGS. 1-5 may be included in FIG. 6. The functionality 600 of FIG. 6 may be implemented as a method executed as instructions on a machine, where the instructions are included on at least one computer readable medium or on a non-transitory machine-readable storage medium.

The functionality 600 may start in block 602. A determination may be performed to determine "X" number of records is equal to at least 1, as in block 604. In block 606, a sleep operation may be performed at time interval "T." A current writing speed W and availability I of CPU resources from the system may be acquired, as in block 608. A determination operation may be performed to determine whether the current writing speed W is greater than the acceptable writing speed "Wmin," as in block 610. If no, the functionality 600 may move to block 618. If yes, a determination operation may be performed to determine whether the availability "I" of CPU resources is greater than the user acceptable availability of CPU resources "Imin," as in block 612. If no, the functionality 600 may move to block 618. If yes, a determination operation may be performed to determine whether X number of records is greater than 1, as in block 614. If no, the functionality may return to block 606.

If yes, X number of records may be decreased ("--"), as in block 616. In block 618, the X number of records may be increased ("++"). That is, as pertaining to blocks 616 and 618, data may be compressed every X records meaning that the smaller the X value is, the more frequently a compression operation is performed. The smallest X value may be represented as 1 (compress every record). A compression operation may use CPU resources and require a certain amount of time. Thus, as more frequent compression operations are performed the more negative is the effect to the writing speed and room of CPU resources (e.g., speed W and availability "I" of CPU resources values decrease). Wmin and Imin values mean the amount of negative effect by compression is allowed by the user during the writing of data operation from the host. The smaller the Wmin and Imin are, the more negative effect the user allows. When the writing speed W is allowed to decrease (e.g., a "W>Wmin" condition is achieved) and the use of more CPU resources are allowed (e.g., a "I>Imin" condition is achieved), the frequency of compression operation increases (e.g., X number of records may be decreased "X−−" of step 616). When the user is not allowed to use more CPU resources and the writing speed W is not allowed to decrease, the frequency of compression operation decreases (e.g., X number of records may be increased "X++" of step 618). The functionality 600 may return to block 606 following blocks 616 and 618.

Figure 7:
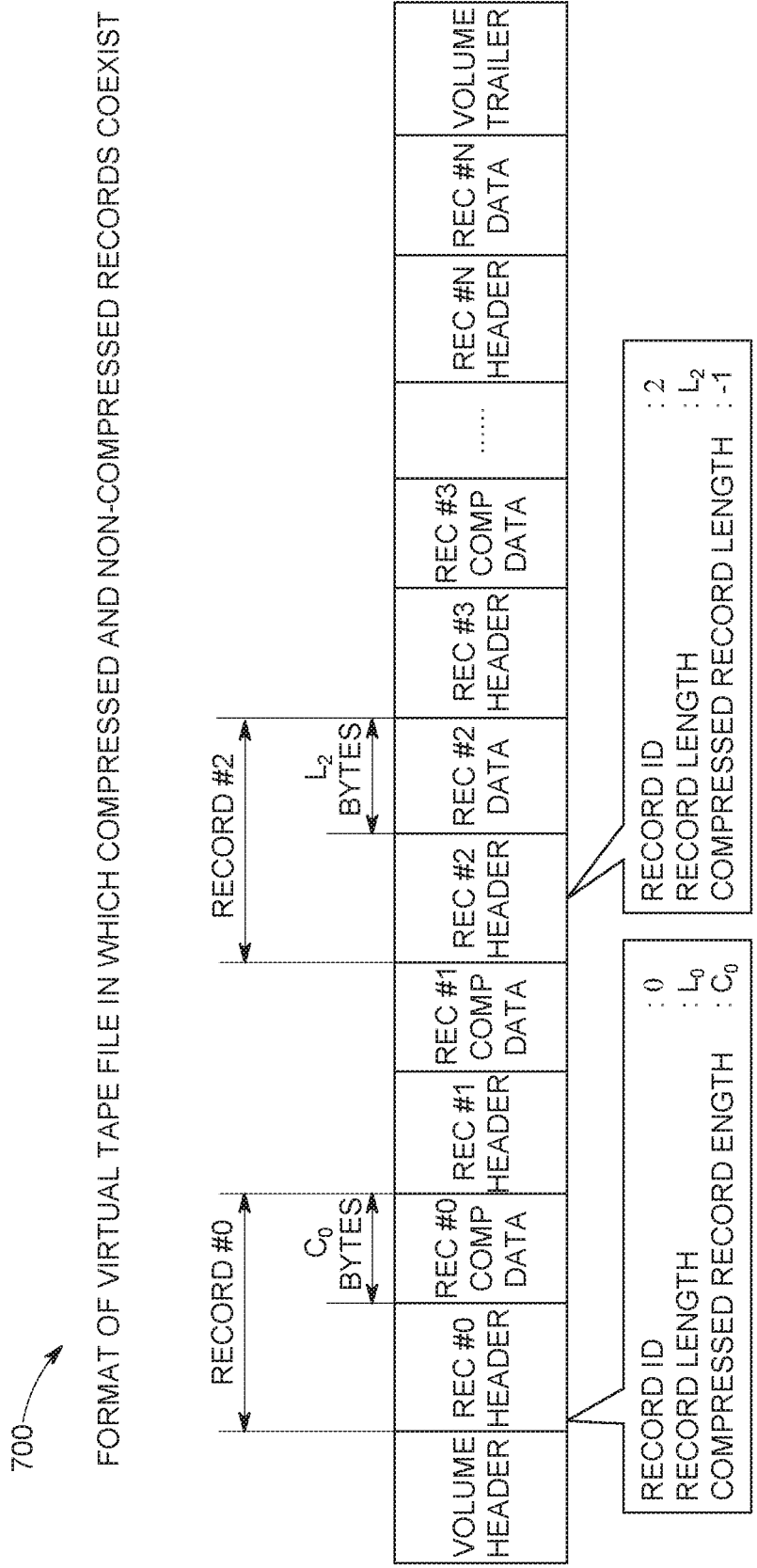
FIG. 7 is a diagram depicting an exemplary format of a virtual tape device in which compressed and non-compressed records coexist in accordance with an embodiment of the present invention.

Upon performing the mechanisms of the illustrated embodiments, compressed and non-compressed records may coexist in the virtual tape device where data is written as shown in FIG. 7. For example, FIG. 7 depicts a volume header, a volume trailer, one or more record headers (e.g., record "rec" #0, . . . , rec #N), record data (e.g., rec #0 data, . . . , rec #N data), and record compressed ("comp") data (e.g., rec #0 comp data, . . . , rec #N comp data). For example, a record header (e.g., Rec #0 header) and record compressed ("comp") data (e.g., rec #0 comp data) is illustrated for record #0. The record header (e.g., Rec #0 header) for record #0 depicts a record identifier ("ID") as "0," a record length ("$L_0$"), and a compressed record length ("$C_0$" of $C_0$ bytes). The record header (e.g., Rec #2 header) for record #2 depicts a record identifier ("ID") as "2," a record length ("$L_2$" of $L_2$ bytes), and a compressed record length of −1 (e.g., −1 meaning that the record data is non-compressed data and the use of "−1" is illustrated herein as an example of marking those records that are not compressed in real time for an actual implementation). However, data may be read from record units and/or written to record units of the virtual tape device and corresponding data compression/decompression may also be performed in the record units. For this reason, any problems of data reading, even when compressed and non-compressed records coexist in the virtual tape device, are eliminated.

Additionally, records in a virtual tape device, which have not been compressed during data writing, may be compressed after data writing to the virtual tape device is completed and when the amount of I/O to and/or from the storage device is small (e.g., less than a defined threshold or value) and there are sufficient CPU resources (e.g., at least one processor device). Thus, each of the records in the virtual tape device may eventually be compressed (e.g., compressing records in the virtual tape device at different time intervals) and only the records having the same capacity such as, for example, the situation where all the records are compressed during writing are saved in the storage device. However, the virtual tape device may be one file. Therefore, even when records are compressed and overwritten at a later period of time, the compressed records may be saved in the form depicted in FIG. 8.

Figure 8:
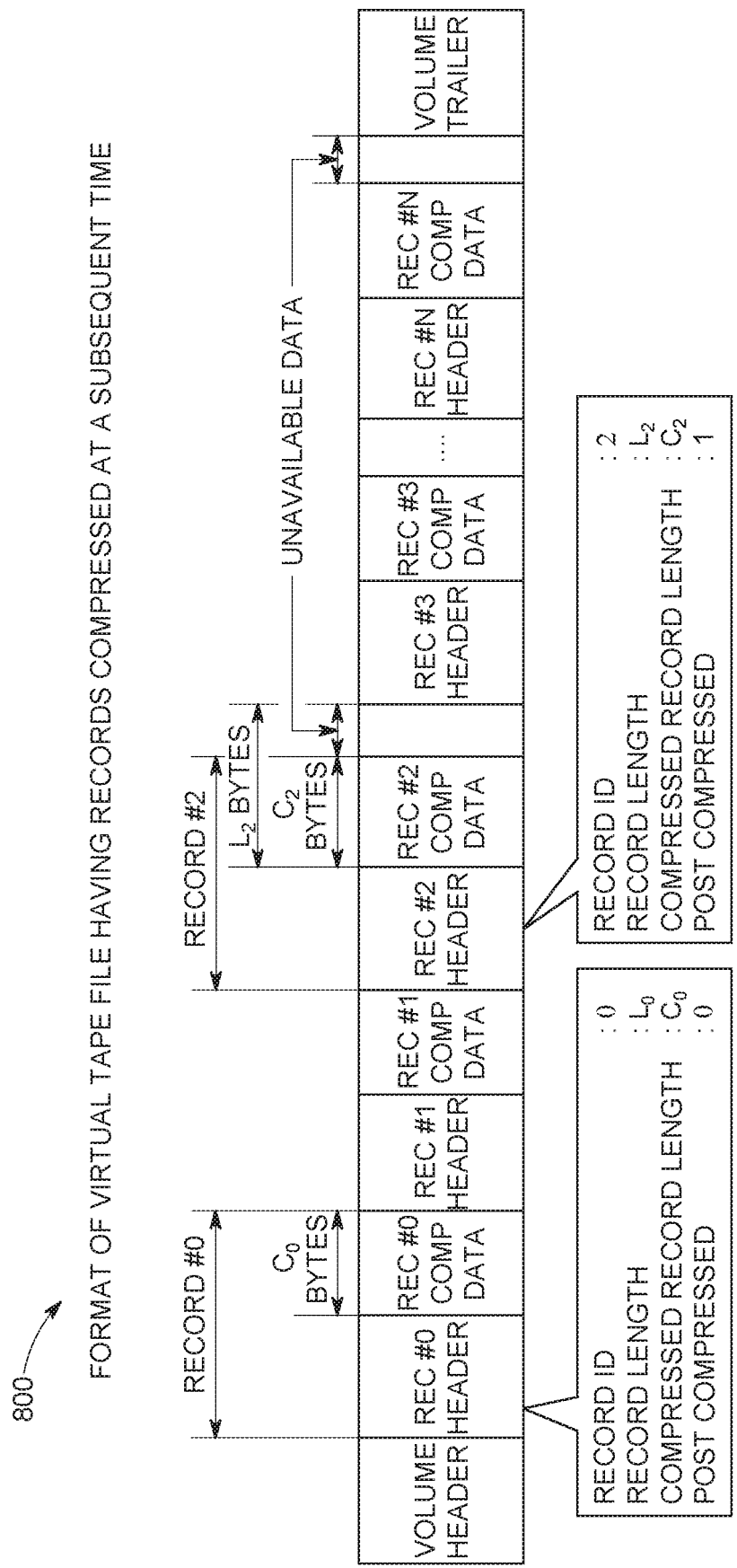
FIG. 8 is a diagram depicting an exemplary format of a virtual tape device having records compressed at a subsequent time period in accordance with an embodiment of the present invention.

For example, FIG. 8 depicts a record header (e.g., Rec #0 header) and record compressed ("comp") data (e.g., rec #0 comp data) for record #0. The record header (e.g., Rec #0 header) for record #0 depicts a record identifier ("ID") as "0," a record length ("$L_0$"), a compressed record length ("$C_0$" of $C_0$ bytes), and a post compressed record of 0. The record header (e.g., Rec #2 header) for record #2 depicts a record identifier ("ID") as "2," a record length ("$L_2$" of $L_2$ bytes), a compressed record length ("$C_2$" of $C_2$ bytes), and a post compressed record of 1.

Figure 9:
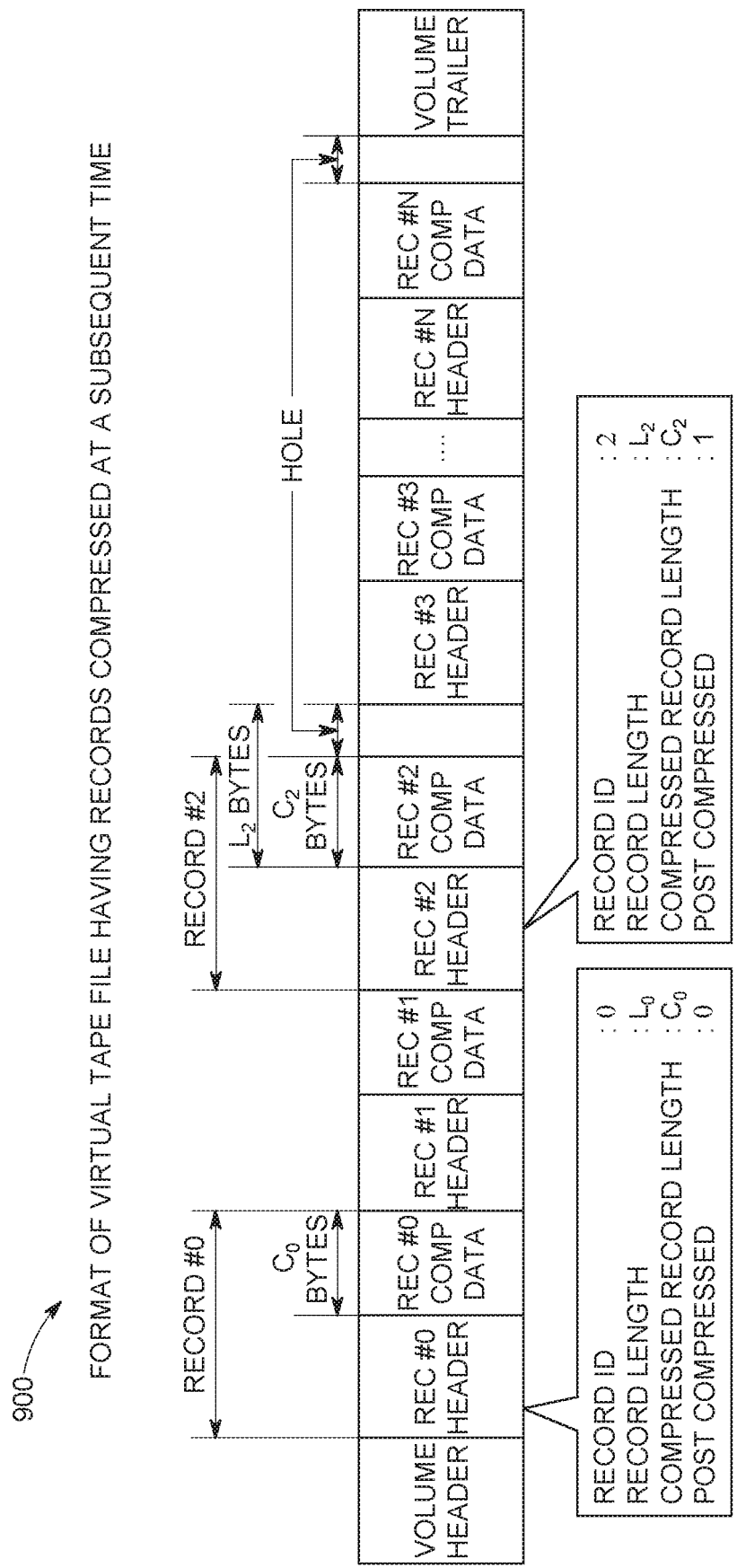
FIG. 9 is a diagram depicting an exemplary format of a virtual tape device having records compressed at a subsequent time period in accordance with an embodiment of the present invention.

In FIG. 8, a difference region (e.g., "unavailable data" region) from the record size before compression may occupy a selected amount of storage capacity even when there are only fractions of unnecessary, non-compressed data. Therefore, the difference region may be released by creating a hole and the virtual tape device is converted to a sparse file, as depicted in FIG. 9. The region with the hole (e.g., "hole region") may be filled with Os when the hole region is read. However, the hole region is actually a region that does not occupy a capacity of the storage device with no block assigned thereto. The hole can be implemented, for example, by causing a fallocate( ) function of a portable operating system interface ("POSIX") in several virtual tape device systems to designate a FALLOC_FL_PUNCH_HOLE flag as a mode. For example, turning now to FIG. 9, the format of a virtual tape device, having records compressed at a subsequent time, is depicted. By performing the compression and/or creating of the hole region after completion of data writing to the virtual tape device, the storage capacity occupied by the file becomes equivalent to that of the virtual tape device (as depicted in FIG. 5) when all the records are compressed during writing.

Accordingly, the present invention may reduce the bandwidth used for writing data and reduce the required or necessary capacity of the storage device by compressing data to a certain degree (e.g., compressing only selected data) in real time during data writing without suffering the negative effects that may impact the performance of the system. Furthermore, post-processing of data in a record, after data writing to the virtual tape device, allows capacity used by the storage device to eventually save the data to be equivalent to that when all the records in the virtual tape device are compressed.

Figure 10:
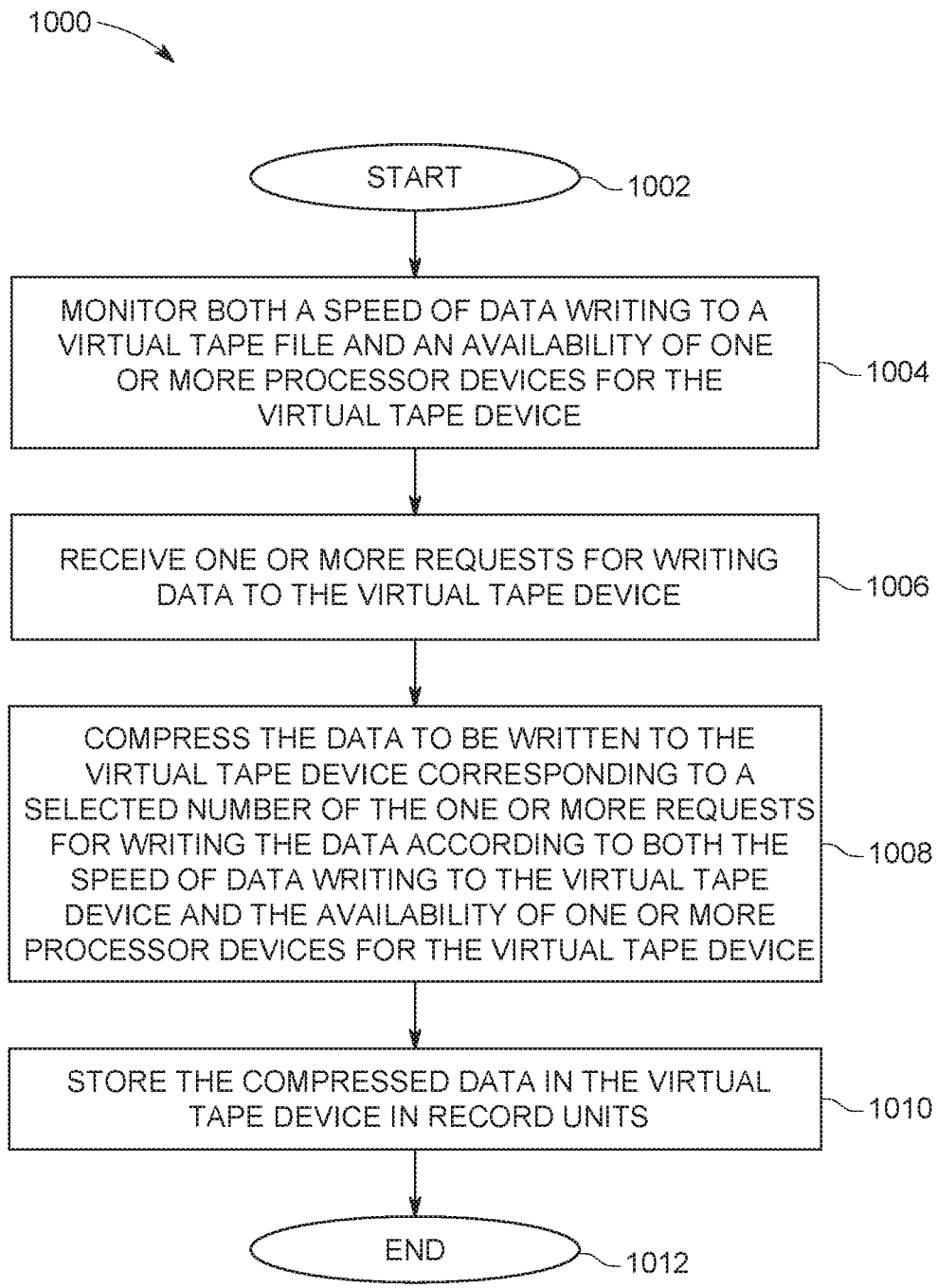
FIG. 10 is a flowchart diagram depicting an exemplary method for reducing data using a plurality of compression operations in a computing storage environment in accordance with an embodiment of the present invention.

Turning now to FIG. 10, a method 1000 for reducing data using a plurality of compression operations in a computing storage environment is depicted, in which various aspects of the illustrated embodiments may be implemented. The functionality 1000 may be implemented as a method executed as instructions on a machine, where the instructions are included on at least one computer readable medium or on a non-transitory machine-readable storage medium. The functionality 1000 may start in block 1002. A speed of data writing to a virtual tape device and an availability of one or more processor devices for the virtual tape device may be monitored, as in block 1004. One or more requests may be received for writing data to the virtual tape device, as in block 1006. Data to be written to the virtual tape device corresponding to a selected number of the one or more requests for writing the data may be compressed according to both the speed of data writing to the virtual tape device and the availability of one or more processor devices for the virtual tape device, as in block 1008. The compressed data may be stored in the virtual tape device in record units, as in block 1010. The functionality 1000 may end in block 1012.

In one aspect, in conjunction with and/or as part of at least one block of FIG. 10, the operations of 1000 may include each of the following. The operations of 1000 may add an indicator to indicate that the data is compressed in a record header region of a corresponding record.

The operations of 1000 may detect non-compressed data that is stored in a record of the virtual tape device, compress the detected non-compressed data according to both the speed of data writing to the virtual tape device and the availability of one or more processor devices for the virtual tape device, and/or create a hole in a record by compressing the detected non-compressed data and converting the virtual tape device to a sparse file.

The operations of 1000 may compress non-compressed data upon completing the writing the data to the virtual tape device, upon determining an amount of Input/Output (I/O) operations to and from the virtual tape device is below a threshold value, according to the availability of one or more processor devices for the virtual tape device, or a combination thereof, and/or compress data corresponding to the selected number of the one or more requests for each N records, wherein N is a positive integer or a selected value.

The operations of 1000 may receive one or more requests for reading data from the virtual tape device; determine whether the data is compressed and stored in records corresponding to the one or more requests for reading data; decompress the compressed data in the records for the data that is determined to be compressed and stored; and/or send the decompressed data to a requester.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

What is claimed is:

1. A method, by a processor, for reducing data using a plurality of compression operations in a computing storage environment, comprising:
   monitoring both a speed of data writing to a virtual tape device and an availability of one or more processor devices for the virtual tape device;
   receiving a write request to write data to the virtual tape device, wherein the data corresponding to the write request is divided into a plurality of records;
   for all of the plurality of records intended to be stored as compressed records on the virtual tape device via a predetermination prior to the write request, compressing, as the plurality of records of the write request are successively received in real-time as a data stream and written to the virtual tape device, a first number of the plurality of records while withholding any compression, as the plurality of records of the write request are successively received in real-time as the data stream and written to the virtual tape device, of a second number of the plurality of records, wherein the compression and withholding of compression is performed according to both the speed of data writing to the virtual tape device and the availability of one or more processor devices for the virtual tape device;
   storing the first number of records of the data corresponding to the write request interleaved with the second number of records of the data corresponding to the write request in the virtual tape device, wherein, during the writing of all of the plurality of records intended to be stored as compressed records to the virtual tape device, the data is selectively compressed for each of N records of the plurality of records during a given interval of time thereby interleaving compressed records with non-compressed records within the data corresponding to the write request, wherein N is a positive integer of a predetermined value which is increased and decreased for the given interval of time by determining performance information inclusive of whether the speed of data writing to the virtual tape device is greater than a user-specified minimally acceptable writing speed and the availability of one or more processor devices for the virtual tape device is greater than a user-specified minimally acceptable availability of the one or more processor devices, and wherein N, corresponding to the first number of records of the data stored as the compressed records, is automatically determined in real-time at each given interval of time by computing the performance information subsequent to a sleep period between each given interval of time; and
   compressing non-compressed data of the plurality of records intended to be stored as compressed records upon completing the writing the data to the virtual tape device when an amount of Input/Output (I/O) operations to and from the virtual tape device is below a threshold value and according to the availability of one or more processor devices for the virtual tape device, wherein the compressing of the non-compressed data is performed such that a capacity used by the virtual tape device subsequent to compressing the non-compressed data is equivalent to a capacity which would have been used by the virtual storage device were all the plurality of records had been compressed while initially performing the writing to the virtual tape device by performing a post-processing operation on each of the second number of the plurality of records subsequent to the compressing upon completion of the writing.

2. The method of claim 1, further including adding an indicator to indicate that the data is compressed in a record header region of a corresponding record.

3. The method of claim 1, further including:
   detecting the non-compressed data that is stored in one of the plurality of records of the virtual tape device; and
   compressing the detected non-compressed data according to both the speed of data writing to the virtual tape device and the availability of one or more processor devices for the virtual tape device.

4. The method according to claim 3, further including creating a hole in one of the plurality of records by compressing the detected non-compressed data and converting the virtual tape device to a sparse file.

5. The method according to claim 1, further including:
   receiving one or more requests for reading data from the virtual tape device;
   determining whether the data is compressed and stored in records corresponding to the one or more requests for reading data;
   decompressing the compressed data in the records for the data that is determined to be compressed and stored; and
   sending the decompressed data to a requester.

6. A system, for reducing data using a plurality of compression operations in a computing storage environment, comprising:
   one or more processors with executable instructions that when executed cause the system to:
      monitor both a speed of data writing to a virtual tape device and an availability of one or more processor devices for the virtual tape device;
      receive a write request to write data to the virtual tape device, wherein the data corresponding to the write request is divided into a plurality of records;
      for all of the plurality of records intended to be stored as compressed records on the virtual tape device via a predetermination prior to the write request, compress, as the plurality of records of the write request are successively received in real-time as a data stream and written to the virtual tape device, a first number of the plurality of records while withholding any compression, as the plurality of records of the write request are successively received in real-time as the data stream and written to the virtual tape device, of a second number of the plurality of records, wherein the compression and withholding of compression is performed according to both the speed of data writing to the virtual tape device and the availability of one or more processor devices for the virtual tape device;
      store the first number of records of the data corresponding to the write request interleaved with the second number of records of the data corresponding to the write request in the virtual tape device, wherein, during the writing of all of the plurality of records intended to be stored as compressed records to the virtual tape device, the data is selectively compressed for each of N records of the plurality of records during a given interval of time thereby interleaving compressed records with non-compressed records within the data corresponding to the write request, wherein N is a positive integer of a predetermined value which is increased and decreased for the given interval of time by determining performance information inclusive of whether the speed of data writing to the virtual tape device is greater than a user-specified minimally acceptable writing speed and the availability of one or more processor devices for the virtual tape device is greater than a user-specified minimally acceptable availability of the one or more processor devices, and wherein N, corresponding to the first number of records of the data stored as the compressed records, is automatically determined in real-time at each given interval of time by computing the performance information subsequent to a sleep period between each given interval of time; and compress non-compressed data of the plurality of records intended to be stored as compressed records upon completing the writing the data to the virtual tape device when an amount of Input/Output (I/O) operations to and from the virtual tape device is below a threshold value and according to the availability of one or more processor devices for the virtual tape device, wherein the compressing of the non-compressed data is performed such that a capacity used by the virtual tape device subsequent to compressing the non-compressed data is equivalent to a capacity which would have been used by the virtual storage device were all the plurality of records had been compressed while initially performing the writing to the virtual tape device by performing a post-processing operation on each of the second number of the plurality of records subsequent to the compressing upon completion of the writing.

7. The system of claim 6, wherein the executable instructions further add an indicator to indicate that the data is compressed in a record header region of a corresponding record.

8. The system of claim 6, wherein the executable instructions further:

detect the non-compressed data that is stored in one of the plurality of records of the virtual tape device; and compress the detected non-compressed data according to both the speed of data writing to the virtual tape device and the availability of one or more processor devices for the virtual tape device.

9. The system of claim 8, wherein the executable instructions further create a hole in one of the plurality of records by compressing the detected non-compressed data and converting the virtual tape device to a sparse file.

10. The system of claim 6, wherein the executable instructions further:

receive one or more requests for reading data from the virtual tape device;

determine whether the data is compressed and stored in records corresponding to the one or more requests for reading data;

decompress the compressed data in the records for the data that is determined to be compressed and stored; and send the decompressed data to a requester.

11. A computer program product for, by one or more processors, reducing data using a plurality of compression operations in a computing storage environment, the computer program product comprising a non-transitory computer-readable storage medium having computer-readable program code portions stored therein, the computer-readable program code portions comprising:

an executable portion that monitors both a speed of data writing to a virtual tape device and an availability of one or more processor devices for the virtual tape device;

an executable portion that receives a write request to write data to the virtual tape device, wherein the data corresponding to the write request is divided into a plurality of records;

an executable portion that, for all of the plurality of records intended to be stored as compressed records on the virtual tape device via a predetermination prior to the write request, compresses, as the plurality of records of the write request are successively received in real-time as a data stream and written to the virtual tape device, a first number of the plurality of records while withholding any compression, as the plurality of records of the write request are successively received in real-time as the data stream and written to the virtual tape device, of a second number of the plurality of records, wherein the compression and withholding of compression is performed according to both the speed of data writing to the virtual tape device and the availability of one or more processor devices for the virtual tape device;

an executable portion that stores the first number of records of the data corresponding to the write request interleaved with the second number of records of the data corresponding to the write request in the virtual tape device, wherein, during the writing of all of the plurality of records intended to be stored as compressed records to the virtual tape device, the data is selectively compressed for each of N records of the plurality of records during a given interval of time thereby interleaving compressed records with non-compressed records within the data corresponding to the write request, wherein N is a positive integer of a predetermined value which is increased and decreased for the given interval of time by determining performance information inclusive of whether the speed of data writing to the virtual tape device is greater than a user-specified minimally acceptable writing speed and the availability of one or more processor devices for the virtual tape device is greater than a user-specified minimally acceptable availability of the one or more processor devices, and wherein N, corresponding to the first number of records of the data stored as the compressed records, is automatically determined in real-time at each given interval of time by computing the performance information subsequent to a sleep period between each given interval of time; and an executable portion that compresses non-compressed data of the plurality of records intended to be stored as compressed records upon completing the writing the data to the virtual tape device when an amount of Input/Output (I/O) operations to and from the virtual tape device is below a threshold value and according to the availability of one or more processor devices for the virtual tape device, wherein the compressing of the non-compressed data is performed such that a capacity used by the virtual tape device subsequent to compressing the non-compressed data is equivalent to a capacity which would have been used by the virtual storage device were all the plurality of records had been compressed while initially performing the writing to the virtual tape device by performing a post-processing operation on each of the second number of the plurality of records subsequent to the compressing upon completion of the writing.

12. The computer program product of claim 11, further including an executable portion that adds an indicator to indicate that the data is compressed in a record header region of a corresponding record.

13. The computer program product of claim 11, further including an executable portion that:
   detects the non-compressed data that is stored in one of the plurality of records of the virtual tape device;
   compresses the detected non-compressed data according to both the speed of data writing to the virtual tape device and the availability of one or more processor devices for the virtual tape device; and
   creates a hole in one of the plurality of records by compressing the detected non-compressed data and converting the virtual tape device to a sparse file.

14. The computer program product of claim 11, further including an executable portion that:
   receives one or more requests for reading data from the virtual tape device;
   determines whether the data is compressed and stored in records corresponding to the one or more requests for reading data;
   decompresses the compressed data in the records for the data that is determined to be compressed and stored; and
   sends the decompressed data to a requester.

* * * * *